United States Patent [19]

Miskin

[11] 4,356,410
[45] Oct. 26, 1982

[54] PULSE TRANSMISSION AND REPETITION CIRCUIT

[75] Inventor: Leslie Miskin, Gundelfingen, Fed. Rep. of Germany

[73] Assignee: ITT Industries, Inc., New York, N.Y.

[21] Appl. No.: 181,562

[22] Filed: Aug. 27, 1980

[30] Foreign Application Priority Data

Sep. 6, 1979 [DE] Fed. Rep. of Germany ....... 2935917

[51] Int. Cl.³ .......................... H03K 5/04; H03K 4/50; H03K 5/156
[52] U.S. Cl. .................................... 307/265; 307/228; 307/494; 307/268
[58] Field of Search ............... 307/228, 265, 266, 267, 307/494, 268; 330/288

[56] References Cited

U.S. PATENT DOCUMENTS

| | | | |
|---|---|---|---|
| 3,280,347 | 10/1966 | Blokker et al. | 307/265 |
| 3,424,926 | 1/1969 | Edwards | 307/265 |
| 4,047,052 | 9/1977 | Koubek et al. | 307/228 |
| 4,047,057 | 9/1977 | Ahmed | 307/266 |
| 4,267,521 | 5/1981 | Yokoyama | 330/288 |

FOREIGN PATENT DOCUMENTS 2655641  4/1978  Fed. Rep. of Germany .

*Primary Examiner*—John S. Heyman
*Attorney, Agent, or Firm*—John T. O'Halloran; Peter C. Van Der Sluys

[57] ABSTRACT

Circuit arrangement for the transmission and the directly following repetition of a pulse, with the duration of the transmitted pulse being equal, and the duration of the repeated pulse being in proportion to the duration of the pulse, by using a differential amplifier-like arrangement of a first and of a second transistor with two load transistors complementary thereto connected as a current-transformer circuit, and with a constant current source arranged within the common emitter circuit comprising the base of the first transistor being applied via an input capacitor to the pulse input and, across a first resistor to a fixed potential the amount of which is smaller than that of the operating voltage and greater than zero, with the signs thereof being equal to that of the operating voltage, the base of the second transistor being connected to the collector thereof and to a capacitor applied to the zero point of the circuit, the emitters of the load transistors being applied across a second and a third resistor to the operating voltage, the emitter of the load transistor of the second transistor being the pulse output, and the duration of the repeated pulse being fixed by the ratio of the collector currents flowing in said load transistors.

2 Claims, 1 Drawing Figure

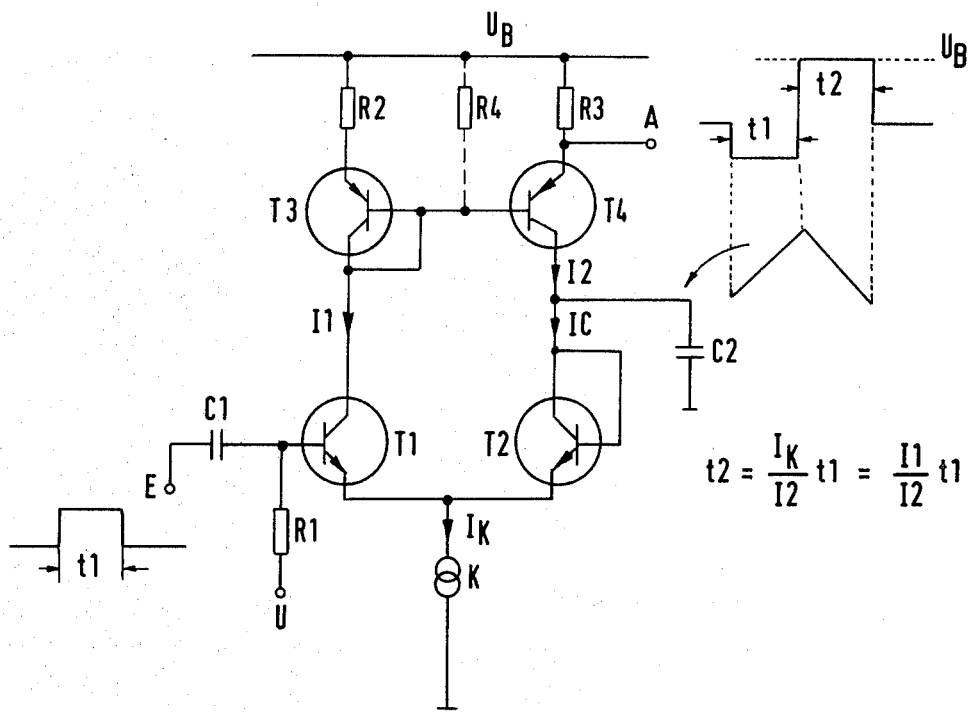

PULSE TRANSMISSION AND REPETITION CIRCUIT

BACKGROUND OF THE INVENTION

The invention relates to a circuit arrangement for the transmission of a first pulse and more particularly, to a circuit that also transmits a second pulse having a duration proportional to the duration of the first pulse. The duration of the first transmitted pulse being equal to the duration of an input pulse. Such circuits use a differential amplifier-like arrangement of a first and of a second transistor with two load transistors complementary thereto connected as a current-transformer circuit, and with a constant current source arranged within the common emitter circuit. Such types of circuits can be used, for example, for signalling the end of a pulse by transmitting the repeated pulse. Thus, for example, in a television receiver, the end of the horizontal (line) or picture (frame) flyback pulse can be used for tripping a gate pulse for the colour burst signal.

SUMMARY OF THE INVENTION

It is the object of the invention to provide such a circuit which is capable of being realized with the aid of simple means, hence for example, as part of an integrated circuit. This object is achieved by connecting the base of the first transistor via an input capacitor to the pulse input and across a first resistor to a fixed potential, the level of which is smaller than that of the operating voltage and greater than zero, with the polarity thereof being equal to that of the operating voltage. The base of the second transistor is connected to the collector thereof and to a capacitor connected to the zero point of the circuit. The emitters of the load transistors are connected across a second and a third resistor to the operating voltage. The emitter of the load transistor of the second transistor is the transmitted pulse output and the duration of the repeated pulse is fixed by the ratio of the collector currents of the first and second transistors flowing in said load transistors.

DESCRIPTION OF THE DRAWING

The FIGURE is a circuit diagram of an embodiment of the invention.

DESCRIPTION OF THE INVENTION

The invention will now be explained in greater detail with reference to the accompanying drawing showing the circuit diagram of one type of embodiment. The first transistor T1 and the second transistor T2 are connected with their emitters via the common constant current source K to the zero point of the circuit, and are thus interconnected in the way of a differential amplifier. The constant current source impresses the current $I_K$ which can divide itself to the two transistors T1, T2, but always only in such a way that $I_K$ will flow. As a constant current source K for this purpose, for example, it is possible to use in the conventional way either a sufficiently high-ohmic resistor applied to a corresponding operating voltage or else a transistor whose base is applied to a fixed potential.

As the collector resistance of the first transistor T1 there is used the load transistor T3 and, in the same way, the load transistor T4 as the collector resistance of the second transistor T2. The two load transistors T3, T4 are connected in the known manner to serve as a current transformer circuit, i.e. in such a way that the two base-emitter paths thereof are arranged in parallel with one another, with the base of the load transistor T3 being directly connected to the collector thereof.

The two load transistors T3, T4 are complementary to the first and the second transistor T1, T2; in this example of embodiment as shown in the drawing, the load transistors are transistors of the pnp-conductivity type. The emitters of the two load transistors T3, T4 are applied, across the second and the third resistors R2, R3, to the operating voltage $U_B$. The emitter of the load transistor T4 is the pulse output A. The base of the second transistor T2 is connected directly to the collector thereof as well as to the collector of the associated load transistor T4. The thus established connecting point is applied via the capacitor C2 to the zero point of the circuit.

The dashline in the drawing still indicates the fourth resistor R4 connecting the two base electrodes of the load transistors T3, T4 to the operating voltage $U_B$, by which it is possible to achieve a greater edge steepness of the output signal.

The collector currents I1, I2 are determinative of the duration t2 of the repeated pulse. The mutual relationship of these currents is adjustable, on one hand, by correspondingly selecting the resistance value of both the second and the third resistors R2, R3 and, on the other hand, by suitably selecting the size of the base-emitter-pn junction areas of the load transistors T3, T4. In distinction thereto, however, the absolute value of the two currents I1, I2 is determined by the current $I_K$.

For the purpose of the following explanation of the mode of operation of the circuit it be assumed that the collector currents I1, I2 are equal. In that case no charging or discharging current will flow via the capacitor C2 in the normal state, hence when no input pulse is applied. Upon commencement of an input pulse, the first transistor T1 is fully driven into saturation and, accordingly, the second transistor T2 is rendered nonconductive. Thus, the current $I_K$ flows alone via the first transistor T1 and the load transistor T3: $I1=I_K$. Owing to the interconnection of the load transistors T3, T4 to form a current mirror, and in the event of an equality of the resistors R2, R3 and of the base-emitter-pn-junction areas of the load transistors T3, T4, this current also flows in the load transistor T4: $I2=I1=I_K$. Accordingly, this current charges the capacitor C2 because the second transistor T2, as already mentioned, is rendered nonconductive.

Now the voltage at both the base and collector of the second transistor T2 increases, but not beyond the base voltage of the first transistor T1 as determined by the voltage U ($0<|U|<|U_B|$) as applied across resistor R1. Upon termination of the input pulse, the base voltage of the first transistor T1 drops below that of the second transistor T2, so that a current will no longer flow either in the first transistor T1 or in the associated load transistor T3. Since, accordingly, also in the other load transistor T4 no current is flowing ($I1=I2=0$), the current $I_K$ as flowing through the second transistor T2 can only originate with the charged capacitor T2, i.e., this capacitor is now discharged by the discharge current $I_C=I_K$. In the assumed case, the charging current is equally high as the discharging current, so that the resulting pulse width t2 is equal to the pulse width t1 of the input pulse.

If, as has already been mentioned hereinbefore, for example, the resistance value of the second resistor R2 is half as high as that of the third resistor R3, and if the base-emitter-pn-junction area of the load transistor T3 is double as large as that of the load transistor T4 then the current flowing through the load transistor T3 will be double as great as that flowing through the load transistor T4. Accordingly, in this case the following is applicable: I2=1/2I1 and I1=I$_K$. Hence, the capacitor C2 is merely charged by the current $\frac{1}{2}$I$_K$. However, at the end of the input pulse no current will be flowing through the load transistors because the first transistor T1 is rendered non-conductive, so that now the discharging current I$_C$ of the capacitor C2 becomes equal to the current I$_K$ of the constant current source K. Accordingly, in this case, the charging current I2 amounts to half the value of the discharging current I$_C$. Thus, an input pulse having a duration t1 produces a duration t2 of the repeated pulse of $\frac{1}{2}$t1. By differently dimensioning both the second and the third resistor R2, R3 in conjunction with the base-emitter-pn-junction areas of the load transistors T3, T4 it is also possible to obtain other proportionality factors relating to the duration of the repeated pulse, because the following is applicable:

$$t2 = (I_K/I2)t1 = (I1/I2)t1.$$

I claim:

1. A circuit arrangement for receiving an input pulse and in response thereto, transmitting a first pulse equal in duration to the input pulse, and a second pulse having a duration proportional to that of the input pulse, said circuit comprising:

first and second transistors each having emitters commonly connected and adapted to be connected to a constant current source;

an input capacitor having a first terminal thereof adapted to receive the input pulse and a second terminal thereof connected to a base of the first transistor;

a first resistor having a first terminal thereof connected to the base of the first transistor and a second terminal adapted to receive a fixed potential greater than zero;

a base of the second transistor being connected to a collector thereof;

a capacitor having a first terminal connected to the collector of the second transistor and a second terminal adapted to be connected to a zero potential;

a third transistor of a type complementary to said first transistor having a collector connected to the collector of the first transistor so that said third transistor functions as a load transistor, the collector of said third transistor also being connected to a base of said third transistor;

a second resistor having a first terminal connected to an emitter of the third transistor and a second terminal adapted to be connected to an operating voltage, said operating voltage being greater then said fixed potential and of the same polarity;

a fourth transistor having a collector connected to the collector of said second transistor and being complementary thereto so as to function as a load transistor;

a base of said fourth transistor being connected to the base of said third transistor; and a third resistor having a first terminal connected to an emitter of said fourth transistor and a second terminal adapted to be connected to said operating voltage, the emitter of said fourth transistor functioning as an output of said circuit for providing the transmitted pulses, the duration of the first transmitted pulse being equal to the duration of the input pulse and the duration of the second transmitted pulse being determined by the ratio of the collector currents of said third and fourth transistors.

2. A circuit arrangement as described in claim 1, additionally comprising a fourth resistor having a first terminal connected to the bases of the third and fourth transistors and a second terminal adapted to be connected to the operating voltage.

* * * * *